(12) United States Patent
Robertson et al.

(10) Patent No.: US 7,335,595 B2
(45) Date of Patent: Feb. 26, 2008

(54) SILICIDE FORMATION USING A LOW TEMPERATURE ANNEAL PROCESS

(75) Inventors: Lance S. Robertson, Rockwall, TX (US); Jiong-Ping Lu, Richardson, TX (US); Donald S. Miles, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 273 days.

(21) Appl. No.: 11/155,151

(22) Filed: Jun. 17, 2005

(65) Prior Publication Data

US 2006/0014387 A1    Jan. 19, 2006

Related U.S. Application Data

(60) Provisional application No. 60/589,303, filed on Jul. 16, 2004.

(51) Int. Cl.
*H01L 21/44* (2006.01)

(52) U.S. Cl. .............. 438/682; 438/663; 257/E21.006; 257/E21.165

(58) Field of Classification Search ................ 438/663, 438/682

See application file for complete search history.

(56) References Cited

U.S. PATENT DOCUMENTS 6,187,617 B1 * 2/2001 Gauthier et al. ............. 438/197
6,605,513 B2 * 8/2003 Paton et al. ................. 438/299
2004/0137650 A1 * 7/2004 Tsuzumitani et al. ......... 438/14

OTHER PUBLICATIONS

American Institute of Physics, vol. 85, No. 3, Yu-Long Jiang et al., Nickel silicidation on n and p-type junctions at 300 degrees C, pp. 410-412, Jul. 19, 2004.
Applied Materials and Stanford University, Eun-Ha Kim et al., Ni2Si and NiSi Formation by Low Temperature Soak and Spike RTPs, Nov. 10, 2005, West Coast Technology Group Meeting, Hillsboro, Oregon.
Solid State Technology, Balasubramanian Ramachandran et al., Nickel silicide formation using low-temperature spike anneal, Oct. 2004.
Proceedings of the 12th IEEE International Conference Advanced Thermal Processing of Semiconductors, Klaus Funk et al., NiSi Contact Information-Process Integration Advantages with Partial Ni Conversion, pp. 94-98, Sep. 28-30, 2004.
IEEE International Workshop on Junction Technology, J.P. Lu et al., Nickel SALICIDE Process Technology for CMOS Devices of 90 nm Node and Beyond, pp. 127-133, May 15-16, 2006, Shanghai, China.

* cited by examiner

*Primary Examiner*—Alexander Ghyka
(74) *Attorney, Agent, or Firm*—Rose Alyssa Keagy; W. James Brady, III; Frederick J. Telecky, Jr.

(57) ABSTRACT

A silicide 160 is formed in exposed silicon on a semiconductor wafer 10 by a method that includes forming a thin interface layer 140 over the semiconductor wafer 10 and performing a first low temperature anneal to create the silicide 160. The method further includes removing an unreacted portion of the interface layer 140 and performing a second low temperature anneal to complete the formation of a low resistance silicide 160.

18 Claims, 2 Drawing Sheets

SILICIDE FORMATION USING A LOW TEMPERATURE ANNEAL PROCESS

CROSS-REFERENCE TO RELATED APPLICATIONS

This application claims the benefit of priority under 35 USC §119(e) of U.S. Provisional Application No. 60/589,303 filed Jul. 16, 2004.

BACKGROUND OF THE INVENTION

This invention relates to silicide formation on semiconductor wafers.

DETAILED DESCRIPTION OF THE INVENTION

Figure 1:
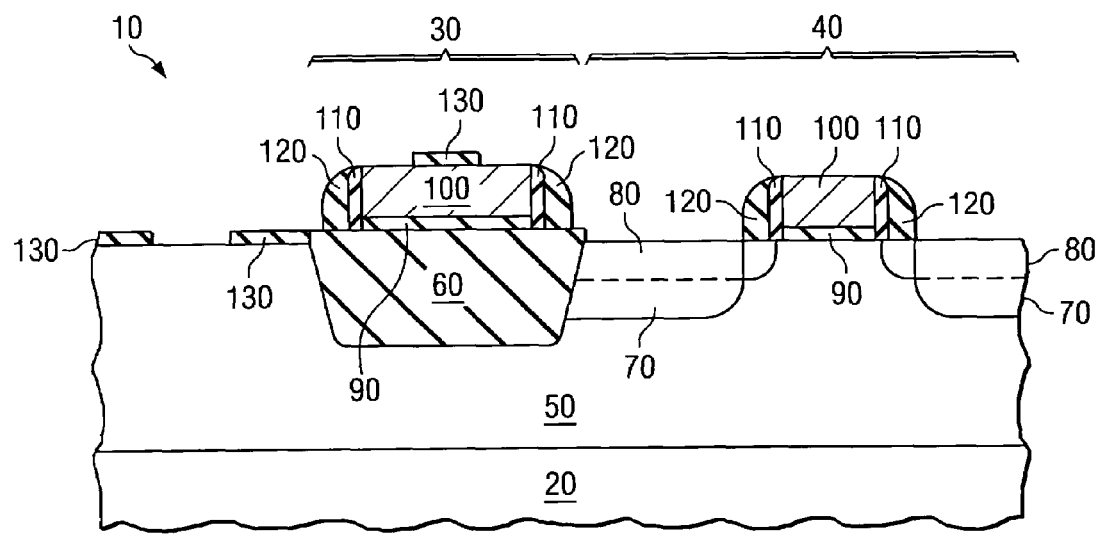
FIGS. 1-4 are cross-sectional diagrams of a process for forming silicide within exposed silicon on a semiconductor wafer in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a partially fabricated semiconductor wafer 10 in accordance with the present invention. Except for the silicidation process described herein, the processing steps for creating a digital or mixed signal (i.e. analog and digital) integrated circuit is any known fabrication process, such as the fabrication processes described in these commonly assigned patent applications: Ser. No. 10/040,749, filed Jan. 21, 2005), Ser. No. 10/920,547, filed Aug. 17, 2004), and Ser. No. 10/943,086, filed Sep. 15, 2004). These patent applications are incorporated herein by reference but not admitted to be prior art with respect to the present invention by their inclusion.

As shown in FIG. 1, non-silicided poly block resistors 30 and CMOS transistors 40 are already formed within a semiconductor substrate 20 having an NMOS or PMOS region 50. In this example application, the CMOS transistor 40 is a NMOS transistor that is formed within a p-well region 50 of the semiconductor substrate 20.

The CMOS transistor 40 is electrically insulated from other active devices by field oxide regions (also known as Shallow Trench Isolation or "STI" regions) 60 formed within the semiconductor substrate 20; however, any conventional isolation structure may be used such as LOCOS structures or implanted isolation regions. The semiconductor substrate 20 is a single-crystalline substrate that is doped to be n-type and p-type; however, it may also be formed by fabricating an epitaxial silicon layer on a single-crystal substrate.

In general, transistors are comprised of a gate, source, and drain. More specifically, as shown in FIG. 1, the active portion of the transistors are comprised of sources/drain regions 70, source/drain extensions 80, and a gate stack that is comprised of a layer of gate oxide 90 and a layer of gate polysilicon 100.

The example NMOS transistor 40 is an n-channel MOS transistor. Therefore it is formed within a p-well region 50 of the semiconductor substrate 20. In addition, the heavily doped source and drain regions 70 (as well as the medium doped source and drain extensions 80) have n-type dopants. The NMOS gate would be created from a n-type doped gate polysilicon electrode 100 and a gate oxide dielectric 90.

A sidewall structure comprising offset layers 110, 120 are used during fabrication to enable the proper placement of the sources/drains 70 and the source/drain extensions 80 respectively. Usually the source/drain extensions 80 are formed using the gate stack 90, 100 and the extension sidewalls 110 as a mask. Similarly, the sources/drains 70 are usually formed with the gate stack 90, 100 and the spacer sidewalls 120 as a mask.

In the example mixed signal application, non-silicided poly resistors 30 are formed over selected field oxide regions 60. The non-silicided poly resistors include extension sidewalls 110, spacer sidewalls 120, and a resistor stack that includes an oxide layer 90 and a polysilicon layer 100. A relatively thin silicide film is formed on the outside portions of the polysilicon surface (i.e. the head of the resistor) during fabrication in order to facilitate electrical connections between the non-silicided poly resistor 30 and other active devices within the circuit.

A patterned dielectric mask 130 may be used to protect selected regions of exposed silicon (i.e. 50, 100) from silicide formation, as shown in FIG. 1. If used, the dielectric mask 130 may be any suitable material such as an oxide or a nitride, or a layered combination of both.

As explained fully below, the next step in the fabrication process is the formation of silicide within exposed silicon surfaces of the semiconductor wafer 10 in accordance with the present invention. The main purpose of the silicide layer is an improvement in the contact resistance between the active devices 30, 40 and the metal contacts (not shown) that electrically connect those devices to the rest of the integrated circuit. The silicide that is formed in accordance with the method of the present invention favors the occurrence of silicide formation over metal diffusion, thereby improving the silicidation of small features and reducing manufacturing defects.

Subsequent fabrication (such as that described in the incorporated patent applications noted above) will create the remainder of the "front end" portion plus the "back-end" portion of the integrated circuit. Generally, the remainder of the front end portion of the integrated circuit contains dielectric material that electrically insulates the metal contacts which electrically connects the resistors 30 and CMOS transistors 40 (shown in FIG. 1) to other active or passive devices (not shown) that are located throughout the semiconductor substrate 20. The back-end portion of the integrated circuit generally contains one or more interconnect layers (and possibly via layers) that properly route electrical signals and power though out the completed integrated circuit.

Figure 2:
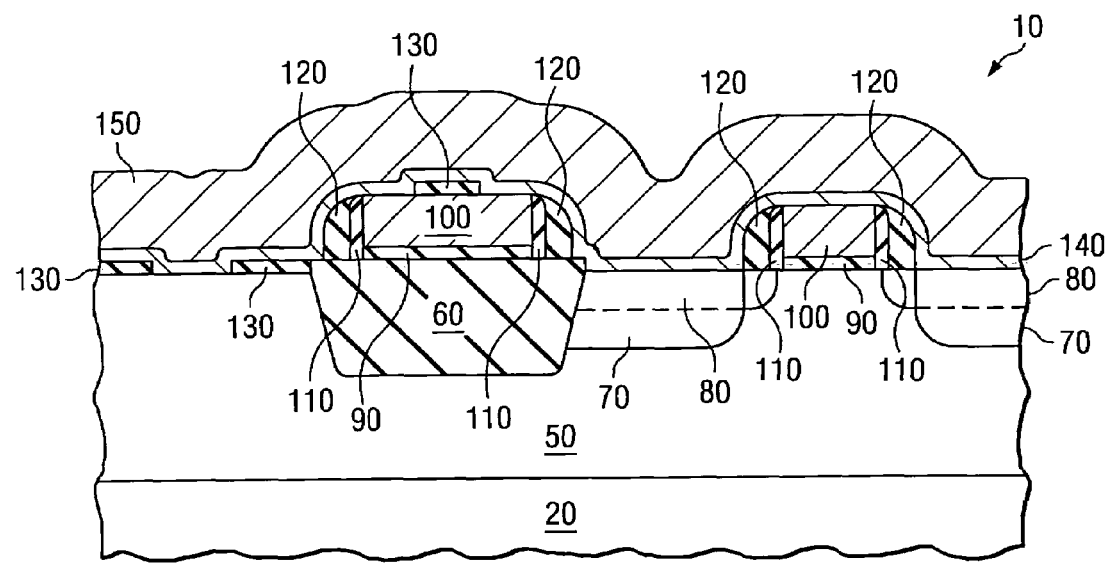
Figure 3:
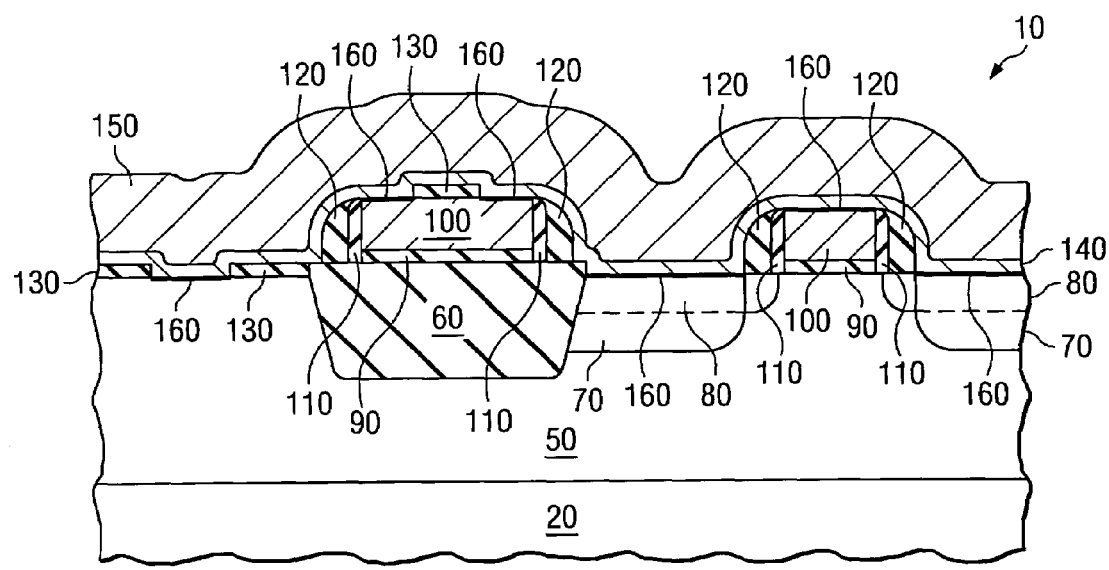
Figure 4:
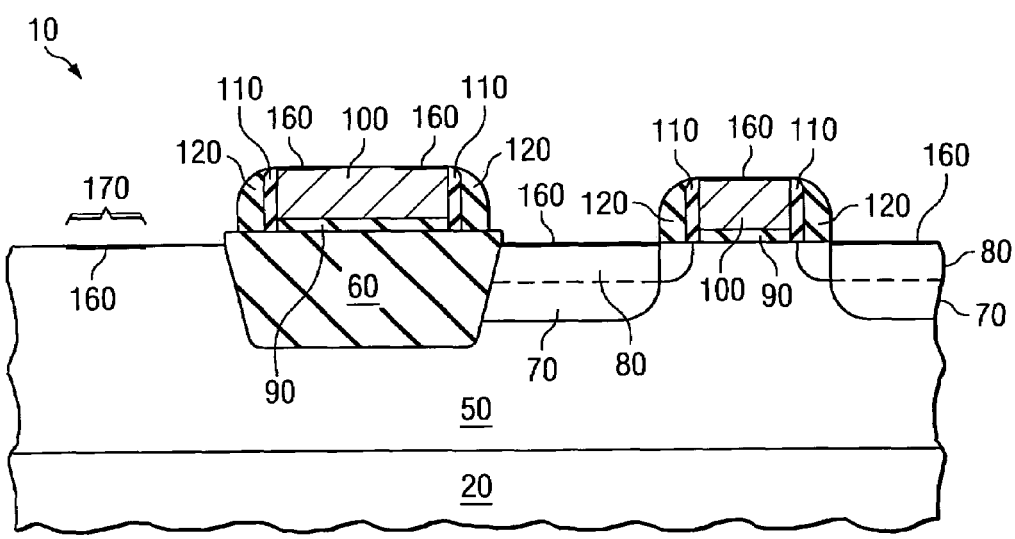

Referring again to the drawings, FIGS. 2-4 are cross-sectional views of a partially fabricated semiconductor wafer 10 that illustrate a method for forming silicide within exposed silicon surfaces of the semiconductor wafer 10 in accordance with the present invention. Those skilled in the art of semiconductor fabrication will easily understand how to modify this process to manufacture PMOS transistors in accordance with this invention.

As shown in FIG. 2, an interface layer 140 of metal is now formed over the top surface of the semiconductor wafer 10. The interface layer 140 is preferably comprised of Ni; however, other suitable materials such as Co, Ta, Ti, W, Mo, Pd, Pt, or an alloy of these metals may be used. In the example application of ultra-shallow junctions (used in advanced CMOS devices), a thin layer of Ni 140 is used, preferably in the range of 5-10 nm.

An optional silicidation capping layer 150 may also be formed over the interface layer 140. If used, the silicidation capping layer 150 acts as a passivation layer that prevents the diffusion of oxygen from ambient into the interface layer 140. The silicidation capping layer 150 is preferably TiN; however it may be any other suitable material such as Ti. In the example application, the thickness of the capping layer is between 5-30 nm.

In accordance with the invention, the semiconductor wafer 10 is now annealed with a first low temperature spike anneal. However, it is within the scope of the invention to perform a short soak instead of the spike anneal. This anneal process will cause a silicide 160 (i.e. a Ni-rich silicide or Ni mono-silicide) to form at the exposed surface of the sources/drain regions 70, the surface of the gate polysilicon 100, the exposed surfaces of the poly resistor polysilicon 100, and in the exposed portion of the well region 50. These silicide regions 160 are shown in FIG. 3. It is to be noted that the interface layer 140 will only react with the exposed silicon; therefore, the silicide 160 formed by the spike or short soak annealing process is considered a self-aligned silicide ("salicide").

Preferably, the first low temperature anneal is a spike anneal that is performed with a rapid thermal anneal ("RTA") process. This preferred RTA process is performed at a temperature around 345° C. with a dwell time as close to zero seconds as possible. However, it is within the scope of the invention to use any suitable temperature between 250° C. and 400° C. In the example application the ramp rate is 15° C./sec. for both the ramp-up and ramp-down. However, it is within the scope of the invention to use a ramp-up rate and ramp-down rate between 5-35° C./sec and a soak anneal time between 0-15 secs. In addition, an inert species such as helium and nitrogen gas is commonly used to optimize both the ramp up and cool down.

As shown in FIG. 4, the next step is the removal of the unreacted portions of the interface layer 140 (and the silicidation capping layer 150, if used) through a selective wet etch process (e.g. using a mixture of sulfuric acid, hydrogen peroxide, and water). The dielectric mask 130, if used, is also removed with any suitable process (such as a dry etch with fluorine-based chemistries). In this example application, the dielectric mask 130 was used to create a diode region 170 within the semiconductor wafer 10.

In accordance with the invention, a second low temperature anneal is now performed with an additional RTA process. This second RTA process is preferably performed at a temperature around 400° C. with a dwell time of approximately 30 seconds. However, it is within the scope of the invention to use any suitable temperature between 350-550° C. and any dwell time between 0-60 seconds. In the example application the ramp rate is 15° C./sec. for both the ramp-up and ramp-down. However, it is within the scope of the invention to use a ramp-up rate and ramp-down rate between 5-35° C./sec. In addition, inert species such as helium and nitrogen gas may be used to optimize the ramp up and cool down. This second anneal will ensure the formation of a mono-silicide NiSi, thereby lowering the sheet resistance of silicide 160.

The fabrication of the semiconductor wafer 10 continues with the fabrication of the remaining front-end and back-end structures (as explained more fully in the incorporated patent applications). Once the fabrication process is complete, the integrated circuit will be tested and then packaged.

Various additional modifications to the invention as described above are within the scope of the claimed invention. As an example, if Co is used instead of Ni for the interface layer 140, then the temperature range for the first low temperature anneal would range between 500-700° C. and the temperature range for the second low temperature RTA would range between 600-900° C. In addition, a cleaning process may be performed after any step in the fabrication process. Moreover, this invention may be implemented in other semiconductor structures such as biCMOS and bipolar transistors.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for forming silicide within portions of an exposed silicon surface of a semiconductor wafer, comprising:

forming a thin interface layer over said semiconductor wafer;

performing a first low temperature anneal to create said silicide;

removing an unreacted portion of said interface layer; and performing a second low temperature anneal to complete formation of a low resistance silicide;

wherein said step of performing a first low temperature anneal comprises a RTA spike anneal process performed with a dwell time of approximately zero seconds.

2. The method of claim 1 wherein said interface layer comprises Ni.

3. The method of claim 2 wherein said Ni interface layer has a thickness between 5-10 nm.

4. The method of claim 1 further comprising the step of forming a capping layer over said interface layer before said step of performing a first low temperature anneal.

5. The method of claim 4 wherein said capping layer comprises TiN.

6. The method of claim 1 wherein said silicide is a self-aligned silicide.

7. The method of claim 1 wherein said RTA spike anneal process is performed at a temperature around 345° C.

8. The method of claim 1 wherein said RTA spike anneal process is performed at a temperature between 250° C. and 400° C.

9. The method of claim 1 wherein said step of performing a second low temperature anneal comprises a RTA process performed at a temperature around 400° C.

10. The method of claim 1 wherein said step of performing a second low temperature anneal comprises a RTA process performed at a temperature between 350° C. and 550° C.

11. The method of claim 1 wherein said step of performing a second low temperature anneal comprises a RTA process performed with a dwell time between 0-60 seconds.

12. The method of claim 1 wherein said interface layer comprises Co.

13. The method of claim 12 wherein said step of performing a second low temperature anneal comprises a RTA process performed at a temperature between 600° C. and 900° C.

14. The method of claim 1 wherein said exposed silicon surface is located over a transistor source and drain region.

15. The method of claim 1 wherein said exposed silicon surface is located over a transistor gate polysilicon region.

16. The method of claim 1 wherein said exposed silicon surface is located over a resistor region.

17. The method of claim 1 wherein said exposed silicon surface is located over a diode region.

18. A method for forming silicide within an exposed silicon surface of a semiconductor wafer, comprising:

forming a thin layer of Ni over said semiconductor wafer;

forming a layer of TiN over said layer of Ni;

performing a first RTA process at a temperature between 250° C. and 400° C. with a dwell time of approximately zero seconds;

removing said layer of TiN and an unreacted portion of said layer of Ni; and performing a second RTA process at a temperature between 350° C. and 550° C. with a dwell time of approximately 30 seconds.

* * * * *